United States Patent
Hwang et al.

(10) Patent No.: US 9,847,057 B2
(45) Date of Patent: Dec. 19, 2017

(54) STRUCTURE OF AMOLED DRIVER CIRCUIT WITH EXTERNAL COMPENSATION

(71) Applicant: Shenzhen China Star Optoelectronics Technology Co., Ltd., Shenzhen (CN)

(72) Inventors: Taijiun Hwang, Shenzhen (CN); Jihshiang Lee, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 114 days.

(21) Appl. No.: 14/914,649

(22) PCT Filed: Dec. 29, 2015

(86) PCT No.: PCT/CN2015/099624
§ 371 (c)(1),
(2) Date: Feb. 26, 2016

(87) PCT Pub. No.: WO2017/080081
PCT Pub. Date: May 18, 2017

(65) Prior Publication Data
US 2017/0256198 A1  Sep. 7, 2017

(30) Foreign Application Priority Data
Nov. 9, 2015  (CN) .......................... 2015 1 0755280

(51) Int. Cl.
G09G 3/32     (2016.01)
G09G 3/3225   (2016.01)
(Continued)

(52) U.S. Cl.
CPC ......... *G09G 3/3225* (2013.01); *G09G 3/3266* (2013.01); *G09G 3/3275* (2013.01);
(Continued)

(58) Field of Classification Search
CPC .. G09G 3/3225; G09G 3/3266; G09G 3/3275; G09G 2320/0233;
(Continued)

(56) References Cited

U.S. PATENT DOCUMENTS

2008/0018568 A1* 1/2008 Chen .................... G09G 3/3233
                                                                  345/82
2011/0279437 A1* 11/2011 Komiya ............... G09G 3/3233
                                                                  345/212
(Continued)

FOREIGN PATENT DOCUMENTS

CN          103165078 A      6/2013

*Primary Examiner* — Ariel Balaoing
(74) *Attorney, Agent, or Firm* — Leong C. Lei

(57) ABSTRACT

The invention provides a structure of AMOLED driver circuit with external compensation, disposing mutually independent detection scan driver module (2) and gate scan driver module (3), disposing data selector (MUX) for each column of pixel unit circuits (1); during frame normal display, the gate scan driver module (3) outputting normal scan driver signals (G(1)-G(n)) through all data selectors (MUX) to the gates of switch TFTs (T1) in each column of pixel unit circuits (1); during frame V-blanking, the detection scan driver module (2) making one of data selectors (MUX) to respectively output corresponding detection scan driver signals to the gates of switch TFT (T1) and detection TFT (T3) of corresponding column of pixel unit circuits (1) to perform detection and compensation on TFT or OLED stage-by-stage during AMOLED panel display duration without affecting display quality.

13 Claims, 5 Drawing Sheets

(51) Int. Cl.
*G09G 3/3266* (2016.01)
*G09G 3/3275* (2016.01)
*H01L 27/32* (2006.01)

(52) U.S. Cl.
CPC . *H01L 27/3248* (2013.01); *G09G 2300/0819* (2013.01); *G09G 2310/0286* (2013.01); *G09G 2310/0291* (2013.01); *G09G 2310/08* (2013.01); *G09G 2320/0233* (2013.01); *G09G 2320/045* (2013.01); *G09G 2330/02* (2013.01); *G09G 2330/12* (2013.01)

(58) Field of Classification Search
CPC ..... G09G 2320/045; G09G 2300/0819; G09G 2310/0291; G09G 2310/08; G09G 2310/02; G09G 2310/0286; G09G 2330/12; G09G 2330/02
See application file for complete search history.

(56) References Cited

U.S. PATENT DOCUMENTS

| | | | |
|---|---|---|---|
| 2014/0049568 A1* | 2/2014 | Qi | G09G 3/3258 345/690 |
| 2015/0042703 A1* | 2/2015 | Chaji | G09G 3/3233 345/694 |
| 2017/0053590 A1* | 2/2017 | Song | G01R 19/1659 |

* cited by examiner

STRUCTURE OF AMOLED DRIVER CIRCUIT WITH EXTERNAL COMPENSATION

BACKGROUND OF THE INVENTION

1. Field of the Invention

The present invention relates to the field of display, and in particular to a structure of active matrix organic light emitting diode (OLED) display (AMOLED) driver circuit with external compensation.

2. The Related Arts

The organic light-emitting diode (OLED) display has the advantages of active light-emitting, low driving voltage, high luminance efficiency, short response time, high clarity and contrast, near 180°, large working temperature range, and ability to realize flexible display and large-area full-color display, and therefore is common considered as the most promising display.

Based on the driving method, OLED display can be categorized as passive matrix OLED display (PMOLED), or active matrix OLED display (AMOLED); that is, the direct addressing and thin film transistor (TFT) addressing, wherein the AMOLED has the pixels arranged in an array, belongs to the active category, has high luminance efficiency, and is often used for high-definition large-area display devices.

The known AMOLED often suffers the problems of un-even luminance among pixels and un-even ageing among the TFTs and the OLED of each pixel, and thus certain compensation is required. FIG. 1 is a schematic view showing a conventional structure of AMOLED driver circuit with external compensation, comprising a plurality of pixel unit circuit 10 arranged in an array, a source driver module 40 and a detection module 50 electrically connecting each row of the pixel unit circuits 10, and a gate scan driver module 30 and a detection scan driver module 20, electrically connecting each column of the pixel unit circuits 10. The gate scan driver module 30 and the detection scan driver module 20 are mutually independent. The detection scan driver module 20 comprises a plurality of cascade first shift register units, having the same number as the number of the rows of the pixel unit circuits. The gate scan driver module 30 comprises a plurality of cascade second shift register units, having the same number as the number of the columns of the pixel unit circuits.

Refer to FIG. 1 and FIG. 2. Each pixel unit circuit 10 comprises a first TFT T10, a second TFT T20, a third TFT T30, and an OLED D1. The gate of the first TFT T10 is connected to a gate scan signal G(n) provided by the gate scan driver module 30 to the corresponding column of the pixel unit circuits where the pixel unit circuit 10 belonging to, and the source is connected to a data signal Vdata provided by the source driver module 40 to the corresponding row of the pixel unit circuits where the pixel unit circuit 10 belonging to; the gate of the second TFT T20 is connected to the drain of the first TFT T10, and the drain is connected to a high level power source ELVDD; the gate of the third TFT T30 is connected to a detection scan driver signal G(n)S provided by the detection scan driver module 20 to the corresponding column of the pixel unit circuits where the pixel unit circuit 10 belonging to, the source is connected to the source of the second TFT T20, and the drain is connected to the detection module 50 through corresponding routing of the row of the pixel unit circuits where the pixel unit circuit 10 belonging to; and the anode of the OLED D1 is connected to the source of the second TFT T20 and the cathode is connected to a low level power source ELVSS.

In the above structure for the known AMOLED driver circuit with external compensation, the first TFT T10 and the third TFT T30 of each column of the pixel unit circuits 10 are controlled respectively by the gate scan driver module 30 and the detection scan driver module 20. To perform TFT or OLED detection under the normal display condition, the detection is often performed during the V-blanking of each frame to avoid affecting the normal display frame. However, during V-blanking, because the gate scan driver signal and the detection scan driver signal outputted respectively by the gate scan driver module 30 and the detection scan driver module 20 are transmitted stage-by-stage from the first stage, the gate scan driver module 30 and the detection scan driver module 20 cannot assign directly which column of pixel unit circuits to be activated. For example, to perform detection on the last column of the pixel unit circuits, the detection can not be performed until the gate scan driver signal and the detection scan driver signal outputted respectively by the gate scan driver module 30 and the detection scan driver module 20 reach the last column of the pixel unit circuits. As shown in FIG. 2, the detection circuit in the detection module 50 corresponding to each pixel unit circuit is usually an integrator 70, the time required to perform signal integral computing and data processing is longer. Because the V-blanking time is limited, the above detection process is unable to be performed within such short time.

SUMMARY OF THE INVENTION

The object of the present invention is to provide a structure of AMOLED driver circuit with external compensation, able to perform detection and compensation for TFT or OLED column-by-column in the display duration of an AMOLED without affecting the display quality.

To achieve the above object, the present invention provides a structure of AMOLED driver circuit with external compensation, which comprises: a plurality of pixel unit circuits arranged in an array, a detection scan driver module, a gate scan driver module, a source driver module electrically connecting each row of pixel unit circuits, a detection module electrically connecting each column of pixel unit circuits, and a data selector disposed corresponding to each column of pixel unit circuits;

wherein the pixel unit circuit comprises: a switch thin film transistor (TFT), a driver TFT, a detection TFT and an organic light-emitting diode (OLED);

the detection scan driver module comprises: a plurality of cascade first shift registers having the same number as the number of the columns of pixel unit circuits, n being a positive integer, the n-th first shift register connected through an n-th detection scan line to the gate of the detection TFT in the corresponding n-th column of pixel unit circuits to provide a detection scan driver signal to the n-th column of pixel unit circuits;

the gate scan driver module comprises: a plurality of cascade second shift registers having the same number as the number of the columns of pixel unit circuits, the n-th second shift register connected to a first input end of the n-th data selector to provide a gate scan driver signal to the n-th column of pixel unit circuits;

the n-th data selector has a second input end inputting the detection scan driver signal provided by the n-th first shift register of the detection scan driver module, and an output end connected through the n-th scan line to the gate of the switch TFT in the n-th column of pixel unit circuits;

the detection scan driver signal has a timing different from the timing of the gate scan driver signal.

Let m be a positive integer. During normal display of the m-th frame, the plurality of the second shift registers of the gate scan driver module outputs the gate scan driver signals for each column of pixel unit circuits in a high level pulse form and a normal stage-by-stage manner, the detection scan driver signal is at the low level, the output end of each data selector selects the first input end and outputs gate scan driver signal to corresponding gate scan line; during the V-blanking of the m-th frame, the m-th first shift register of the detection scan driver module outputs the m-th detection scan driver signal in the high level pulse form, the gate scan driver signal is at the low level, the output end of the m-th data selector selects the second input end and outputs the m-th detection scan driver signal to corresponding m-th gate scan line so as to perform detection on the driver TFT and OLED in the m-th column of pixel unit circuits.

The detection scan driver signal propagates to the next stage only during the V-blanking of each frame.

During the V-blanking duration of the (m+1)-th frame, the (m+1)-th first shift register of the detection scan driver module outputs the (m+1)-th detection scan driver signal in the high level pulse form, the gate scan driver signal is at the low level, the output end of the (m+1)-th data selector selects the second input end and outputs the (m+1)-th detection scan driver signal to corresponding (m+1)-th gate scan line so as to perform detection on the driver TFT and OLED in the (m+1)-th column of pixel unit circuits.

The source of the switch TFT is connected to the data signal of the row where the corresponding pixel unit circuit belongs provided by the source driver module; the gate of the driver TFT is connected to the drain of the switch TFT, the drain is connected to the high level power source; the source of the detection TFT is connected to the source of the driver TFT, the drain is connected to the detection module through the routing of the row where the corresponding pixel unit circuit belongs; the anode of the OLED is connected to the source of the driver TFT and the cathode is connected to the low level power source.

The detection circuit of the detection module corresponding to each pixel unit circuit is an integrator comprising an operational amplifier and a capacitor, the negative input end of the operational amplifier is connected to the drain of the detection TFT of the corresponding pixel unit circuit, and the positive input end is connected to the common mode voltage, the capacitor has one end connected to the negative input end of the operational amplifier and the other end connected to the output end of the operational amplifier.

During the normal display of the m-th frame, a logic signal 0 is inputted to the control end of each data selector to control the output end of each data selector to selects the first input end.

During the V-blanking of the m-th frame, a logic signal 1 is inputted to the control end of the m-th data selector to control the output end of the m-th data selector to selects the second input end.

The present invention also provides a structure of AMOLED driver circuit with external compensation, which comprises: a plurality of pixel unit circuits arranged in an array, a detection scan driver module, a gate scan driver module, a source driver module electrically connecting each row of pixel unit circuits, a detection module electrically connecting each column of pixel unit circuits, and a data selector disposed corresponding to each column of pixel unit circuits;

wherein the pixel unit circuit comprises: a switch thin film transistor (TFT), a driver TFT, a detection TFT and an organic light-emitting diode (OLED);

the detection scan driver module comprises: a plurality of cascade first shift registers having the same number as the number of the columns of pixel unit circuits, n being a positive integer, the n-th first shift register connected through an n-th detection scan line to the gate of the detection TFT in the corresponding n-th column of pixel unit circuits to provide a detection scan driver signal to the n-th column of pixel unit circuits;

the gate scan driver module comprises: a plurality of cascade second shift registers having the same number as the number of the columns of pixel unit circuits, the n-th second shift register connected to a first input end of the n-th data selector to provide a gate scan driver signal to the n-th column of pixel unit circuits;

the n-th data selector has a second input end inputting the detection scan driver signal provided by the n-th first shift register of the detection scan driver module, and an output end connected through the n-th scan line to the gate of the switch TFT in the n-th column of pixel unit circuits;

the detection scan driver signal has a timing different from the timing of the gate scan driver signal;

wherein m is a positive integer, during normal display of the m-th frame, the plurality of the second shift registers of the gate scan driver module outputs the gate scan driver signals for each column of pixel unit circuits in a high level pulse form and a normal stage-by-stage manner, the detection scan driver signal is at the low level, the output end of each data selector selects the first input end and outputs gate scan driver signal to corresponding gate scan line;

during the V-blanking of the m-th frame, the m-th first shift register of the detection scan driver module outputs the m-th detection scan driver signal in the high level pulse form, the gate scan driver signal is at the low level, the output end of the m-th data selector selects the second input end and outputs the m-th detection scan driver signal to corresponding m-th gate scan line so as to perform detection on the TFT and OLED in the m-th column of pixel unit circuits;

the detection scan driver signal propagates to the next stage only during the V-blanking of each frame;

the source of the switch TFT is connected to the data signal of the row where the corresponding pixel unit circuit belongs provided by the source driver module; the gate of the driver TFT is connected to the drain of the switch TFT, the drain is connected to the high level power source; the source of the detection TFT is connected to the source of the driver TFT, the drain is connected to the detection module through the routing of the row where the corresponding pixel unit circuit belongs; the anode of the OLED is connected to the source of the driver TFT and the cathode is connected to the low level power source.

Compared to the known techniques, the present invention provides the following advantages: the present invention provides a structure of AMOLED driver circuit with external compensation, disposing mutually independent detection scan driver module and gate scan driver module, disposing data selector corresponding to each column of pixel unit circuits; during normal display of a frame, the gate scan driver module outputting normal scan driver signals through all the data selectors to the gates of the switch TFTs in each column of pixel unit circuits; during the V-blanking of the frame, the detection scan driver module making one of the data selectors to respectively output corresponding detection scan driver signals to the gates of the switch TFTs and detection TFTs of the corresponding column of pixel unit circuits so as to perform detection and compensation on the TFT or OLED stage-by-stage during the AMOLED panel display duration without affecting the display quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
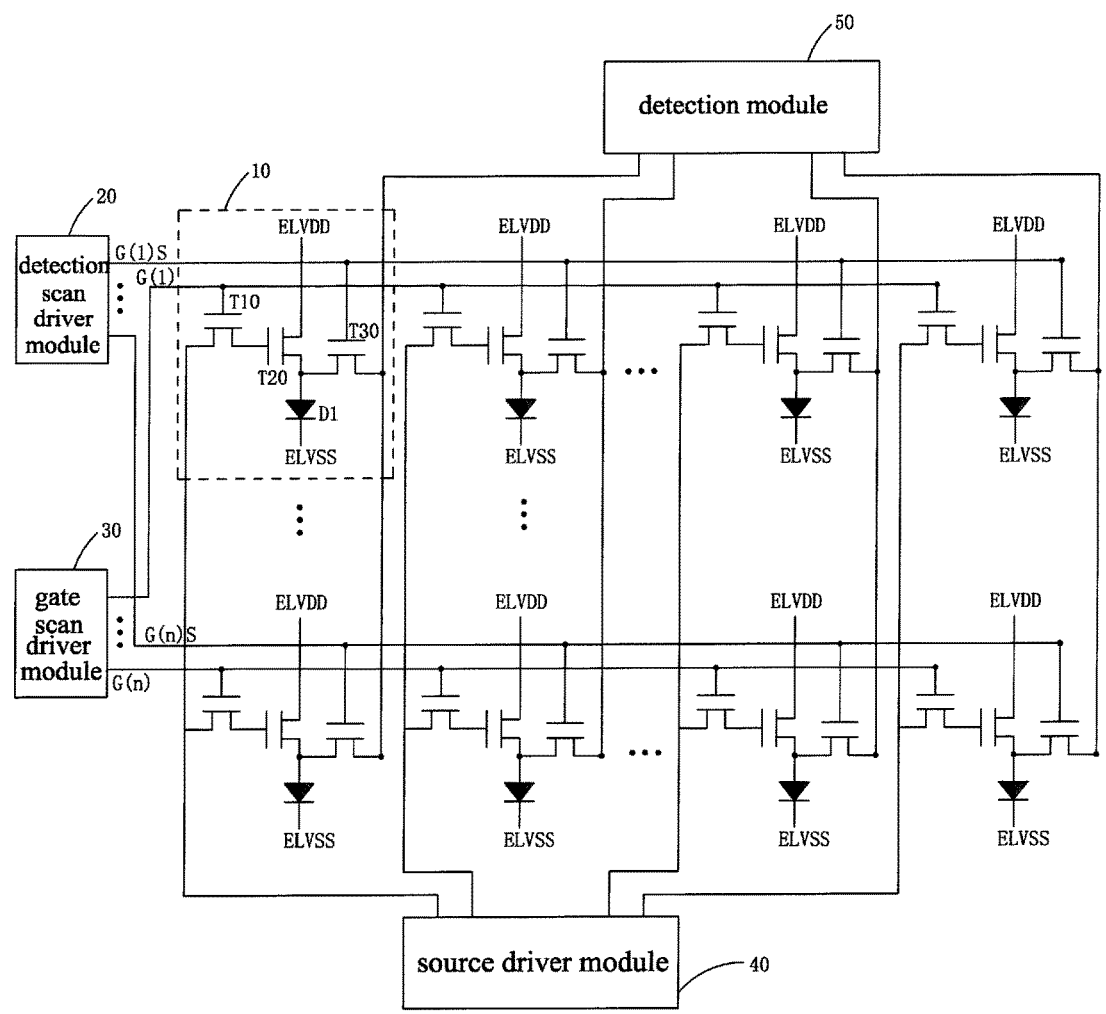
FIG. 1 is a schematic view showing a structure of known AMOLED driver circuit with external compensation.
Figure 2:
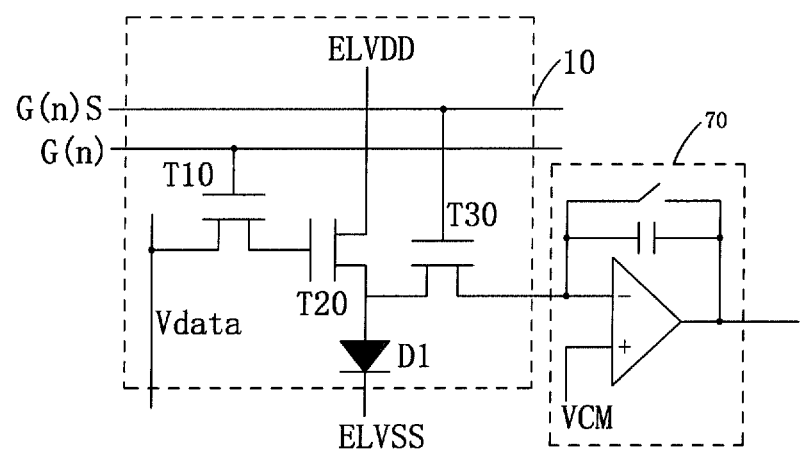
FIG. 2 is a schematic view showing a pixel unit circuit and the detection circuit in the detection module of FIG. 1.
Figure 3:
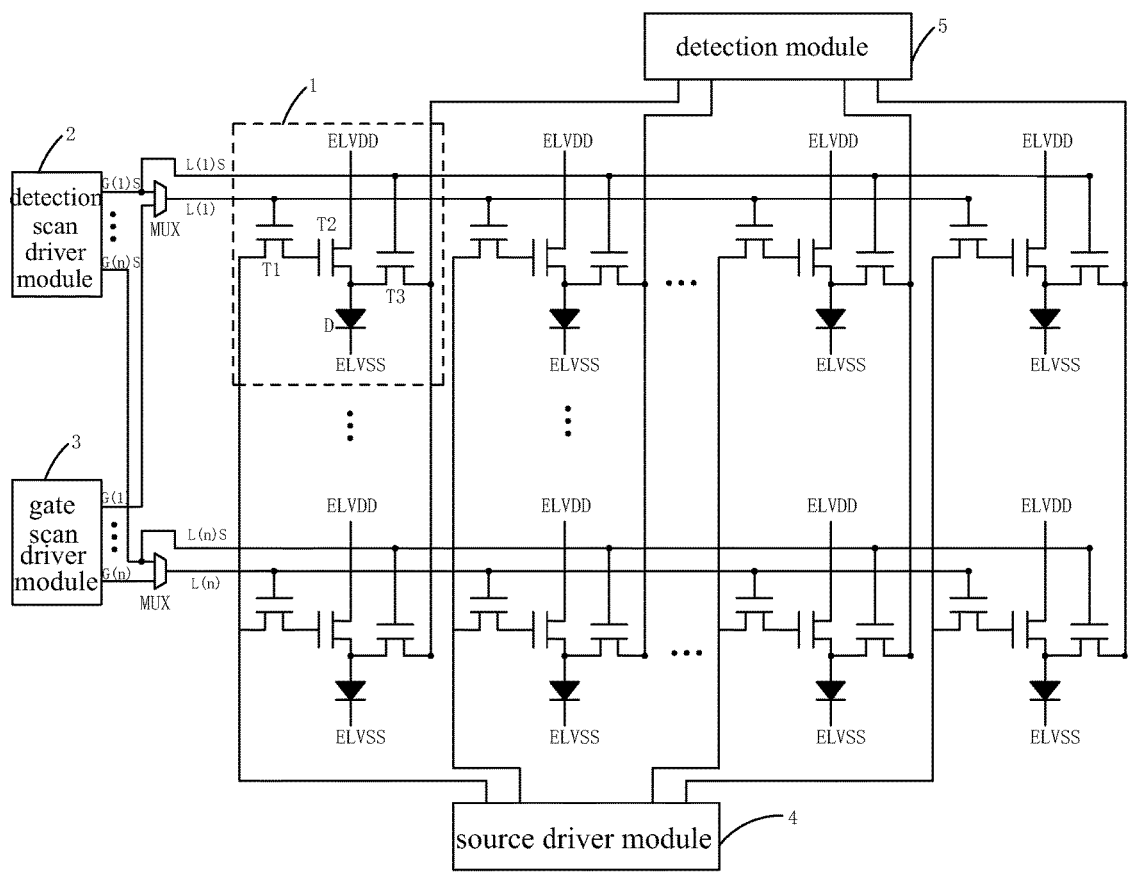
FIG. 3 is a schematic view showing a structure of AMOLED driver circuit with external compensation provided by an embodiment of the present invention.
Figure 7:
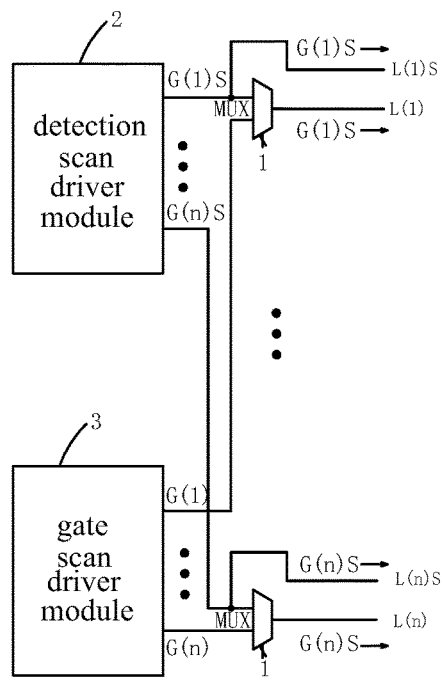
FIG. 7 is a schematic view showing the output of the data selector of the structure of AMOLED driver circuit with external compensation during the V-blanking duration of a frame provided by an embodiment of the present invention.

Refer to FIG. 3 and FIG. 7. The present invention provides a structure of AMOLED driver circuit with external compensation, which comprises: a plurality of pixel unit circuits 1 arranged in an array, a detection scan driver module 2, a gate scan driver module 3, a source driver module 4 electrically connecting each row of pixel unit circuits 1, a detection module 5 electrically connecting each column of pixel unit circuits 1, and a data selector MUX disposed corresponding to each column of pixel unit circuits.

As shown in FIG. 3, the pixel unit circuit 1 comprises: a switch thin film transistor (TFT) T1, a driver TFT T2, a detection TFT T3, and an organic light-emitting diode (OLED) D.

The detection scan driver module 2 comprises: a plurality of cascade first shift registers having the same number as the number of the columns of pixel unit circuits 1, n being a positive integer, the n-th first shift register connected through an n-th detection scan line L(n)S to the gate of the detection TFT T3 in the corresponding n-th column of pixel unit circuits 1 to provide a detection scan driver signal G(n)S to the n-th column of pixel unit circuits 1.

The gate scan driver module 3 comprises: a plurality of cascade second shift registers having the same number as the number of the columns of pixel unit circuits 1, the n-th second shift register connected to a first input end of the n-th data selector MUX to provide a gate scan driver signal G(n) to the n-th column of pixel unit circuits 1.

The n-th data selector has a second input end inputting the detection scan driver signal G(n)S provided by the n-th first shift register of the detection scan driver module 2, and an output end connected through the n-th scan line L(n) to the gate of the switch TFT T1 in the n-th column of pixel unit circuits 1.

Figure 4:
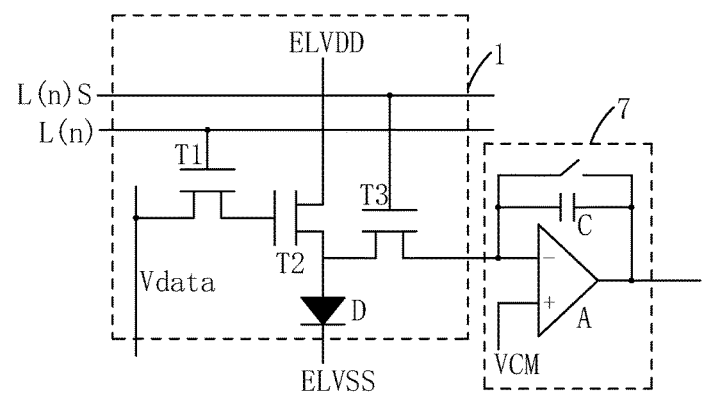
FIG. 4 is a schematic view showing a pixel unit circuit and the detection circuit in the detection module of FIG. 3.

Moreover, refer to FIG. 3 and FIG. 4. The source of the switch TFT T1 is connected to the data signal Vdata of the row where the corresponding pixel unit circuit 1 belongs provided by the source driver module 4; the gate of the driver TFT T2 is connected to the drain of the switch TFT T1, the drain is connected to the high level power source ELVDD; the source of the detection TFT T3 is connected to the source of the driver TFT T2, the drain is connected to the detection module 5 through the routing of the row where the corresponding pixel unit circuit 1 belongs; the anode of the OLED D is connected to the source of the driver TFT T2 and the cathode is connected to the low level power source ELVSS.

The detection circuit of the detection module 5 corresponding to each pixel unit circuit 1 is an integrator 7 comprising an operational amplifier A and a capacitor C, the negative input end of the operational amplifier A is connected to the drain of the detection TFT T3 of the corresponding pixel unit circuit 1, and the positive input end is connected to the common mode voltage VCM; the capacitor C has one end connected to the negative input end of the operational amplifier A and the other end connected to the output end of the operational amplifier A.

Figure 5:
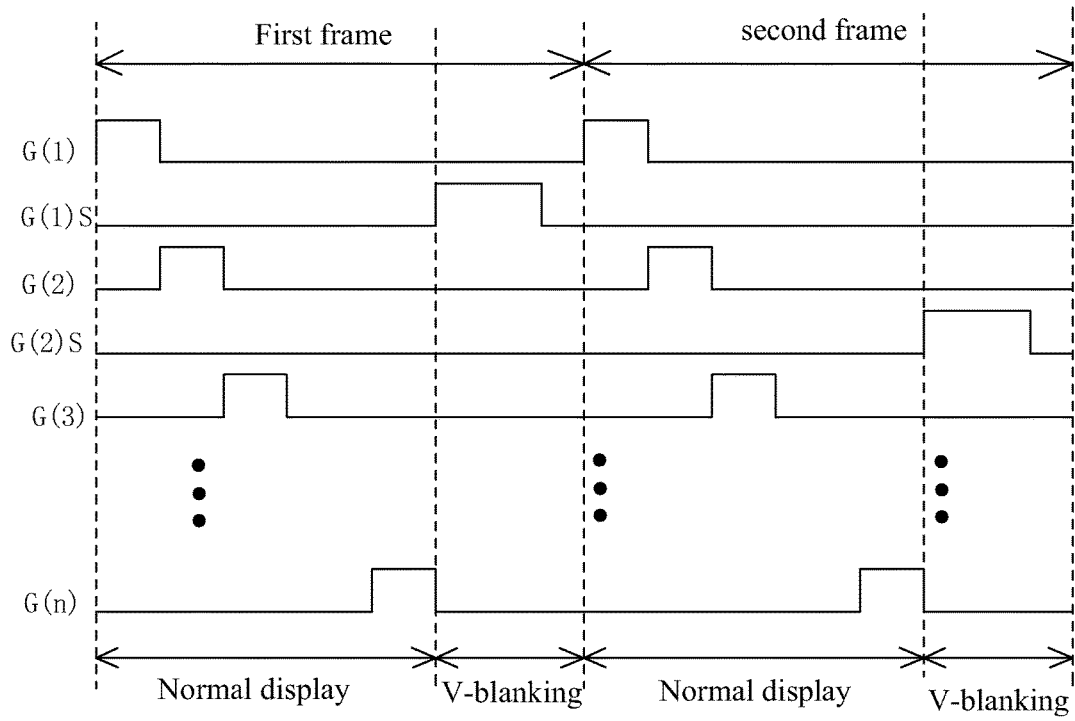
FIG. 5 is a schematic view showing the operation timing of the structure of AMOLED driver circuit with external compensation provided by an embodiment of the present invention.
Figure 6:
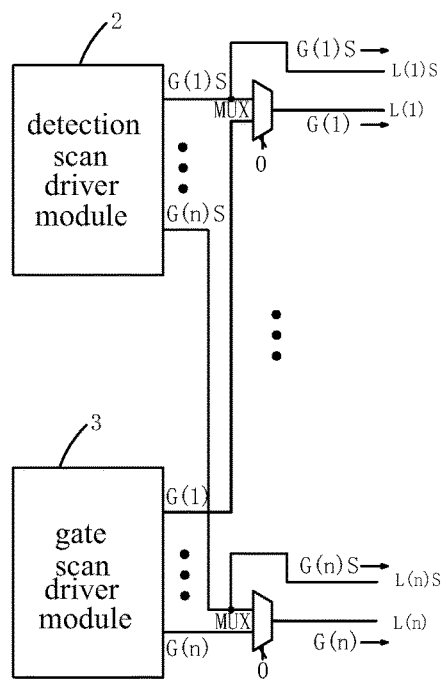
FIG. 6 is a schematic view showing the output of the data selector of the structure of AMOLED driver circuit with external compensation during the normal display of a frame provided by an embodiment of the present invention.

It should be noted that, referring to FIG. 3 and FIG. 5, the detection scan driver module 2 and the gate scan driver module 3 are mutually independent. The detection scan driver signal has a timing different from the timing of the gate scan driver signal. The display duration of a frame is divided into normal display duration and V-blanking duration. Specifically, let m be a positive integer, during normal display of the m-th frame, the plurality of the second shift registers of the gate scan driver module 3 outputs the gate scan driver signals G(1)-G(n) for each column of pixel unit circuits 1 in a high level pulse form and a normal stage-by-stage manner, the detection scan driver signals G(1)S-G(n)S are at the low level, referring to FIG. 6, the output end of each data selector MUX selects the first input end and outputs gate scan driver signals G(1)-G(n) to corresponding gate scan lines L(1)-L(n) so that the driver TFT T2 in each column of pixel unit circuits 1 becomes conductive and the detection TFT T3 becomes cut-off to perform normal display column-by-column; during the V-blanking of the m-th frame, the m-th first shift register of the detection scan driver module 2 outputs the m-th detection scan driver signal G(m)S in the high level pulse form, the gate scan driver signal G(1)-G(n) are at the low level, referring to FIG. 7, the output end of the m-th data selector MUX selects the second input end and outputs the m-th detection scan driver signal G(m)S to corresponding m-th gate scan line L(m), i.e., the m-th detection scan driver signal G(m)S simultaneously reaches the m-th detection scan line L(m)S and the m-th gate scan line L(m) corresponding to the m-th column of pixel unit circuit 1, so that the driver TFT T2 and the detection TFT T3 in the m-th column of pixel unit circuits 1 become conductive so as to perform detection on the driver TFT T2 and OLED D in the m-th column of pixel unit circuits 1. Furthermore, during the normal display of the m-th frame, a logic signal 0 is inputted to the control end of each data selector MUX to control the output end of each data selector MUX to selects the first input end; and during the V-blanking of the m-th frame, a logic signal 1 is inputted to the control end of the m-th data selector MUX to control the output end of the m-th data selector MUX to selects the second input end.

The detection scan driver signal propagates to the next stage only during the V-blanking of each frame;

In the following-blanking duration of the (m+1)-th frame, the (m+1)-th first shift register of the detection scan driver module 2 outputs the (m+1)-th detection scan driver signal G(m+1)S in the high level pulse form, the gate scan driver signals G(1)-G(n) are at the low level, the output end of the (m+1)-th data selector MUX selects the second input end and outputs the (m+1)-th detection scan driver signal G(m+1)S to corresponding (m+1)-th gate scan line L(m+1), i.e., the (m+1)-th detection scan driver signal G(m+1)S simultaneously reaches the (m+1)-th detection scan line L(m+1)S and the (m+1)-th gate scan line L(m+1) corresponding to the (m+1)-th column of pixel unit circuit 1, so that the driver TFT T2 and the detection TFT T3 in the (m+1)-th column of pixel unit circuits 1 become conductive so as to perform detection on the TFT and OLED in the (m+1)-th column of pixel unit circuits.

For example, during normal display of the first frame, the output end of each data selector MUX selects the first input end and outputs gate scan driver signals G(1)-G(n) to corresponding gate scan lines L(1)-L(n) so that the driver TFT T2 in each column of pixel unit circuits 1 becomes conductive and the detection TFT T3 becomes cut-off to perform normal display column-by-column; during the V-blanking of the first frame, the first first shift register of the detection scan driver module 2 outputs the first detection scan driver signal G(1)S in the high level pulse form, the gate scan driver signal G(1)-G(n) are at the low level, the output end of the first data selector MUX selects the second input end and outputs the first detection scan driver signal G(1)S to the first gate scan line L(1), i.e., thefirst detection scan driver signal G(1)S simultaneously reaches the first detection scan line L(1)S and the first gate scan line L(1) corresponding to the first column of pixel unit circuit 1, so that the driver TFT T2 and the detection TFT T3 in the first column of pixel unit circuits 1 become conductive so as to perform detection on the driver TFT T2 and OLED D in the m-th column of pixel unit circuits 1.

In the following-blanking duration of the second frame, the second first shift register of the detection scan driver module 2 outputs the second detection scan driver signal G(2)S in the high level pulse form, the gate scan driver signals G(1)-G(n) are at the low level, the output end of the second data selector MUX selects the second input end and outputs the second detection scan driver signal G(2)S to corresponding second gate scan line L(2), i.e., the second detection scan driver signal G(2)S simultaneously reaches the (m+1)-th detection scan line L(2)S and the second gate scan line L(2) corresponding to the second column of pixel unit circuit 1, so that the driver TFT T2 and the detection TFT T3 in the second column of pixel unit circuits 1 become conductive so as to perform detection on the TFT and OLED in the second column of pixel unit circuits.

It should be noted that the detection scan driver module 2, the gate scan driver module 3, and the plurality of data selector MUX can be integrated into an integrated circuit (IC).

In summary, the present invention provides a structure of AMOLED driver circuit with external compensation, disposing mutually independent detection scan driver module and gate scan driver module, disposing data selector corresponding to each column of pixel unit circuits; during normal display of a frame, the gate scan driver module outputting normal scan driver signals through all the data selectors to the gates of the switch TFTs in each column of pixel unit circuits; during the V-blanking of the frame, the detection scan driver module making one of the data selectors to respectively output corresponding detection scan driver signals to the gates of the switch TFTs and detection TFTs of the corresponding column of pixel unit circuits so as to perform detection and compensation on the TFT or OLED stage-by-stage during the AMOLED panel display duration without affecting the display quality.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A structure of AMOLED driver circuit with external compensation, which comprises: a plurality of pixel unit circuits arranged in an array, a detection scan driver module, a gate scan driver module, a source driver module electrically connecting each row of pixel unit circuits, a detection module electrically connecting each column of pixel unit circuits, and a data selector disposed corresponding to each column of pixel unit circuits; wherein:

the pixel unit circuit comprises: a switch thin film transistor (TFT), a driver TFT, a detection TFT and an organic light-emitting diode (OLED);

the detection scan driver module comprises: a plurality of cascade first shift registers having the same number as the number of the columns of pixel unit circuits, n being a positive integer, the n-th first shift register connected through an n-th detection scan line to the gate of the detection TFT in the corresponding n-th column of pixel unit circuits to provide a detection scan driver signal to the n-th column of pixel unit circuits;

the gate scan driver module comprises: a plurality of cascade second shift registers having the same number as the number of the columns of pixel unit circuits, the n-th second shift register connected to a first input end of the n-th data selector to provide a gate scan driver signal to the n-th column of pixel unit circuits;

the n-th data selector has a second input end inputting the detection scan driver signal provided by the n-th first shift register of the detection scan driver module, and an output end connected through the n-th scan line to the gate of the switch TFT in the n-th column of pixel unit circuits; and the detection scan driver signal has a timing different from the timing of the gate scan driver signal.

2. The structure of AMOLED driver circuit with external compensation as claimed in claim 1, wherein for a positive integer m, during normal display of the m-th frame, the plurality of the second shift registers of the gate scan driver module outputs the gate scan driver signals for each column of pixel unit circuits in a high level pulse form and a normal stage-by-stage manner, the detection scan driver signal is at the low level, the output end of each data selector selects the first input end and outputs gate scan driver signal to corresponding gate scan line; during the V-blanking of the m-th frame, the m-th first shift register of the detection scan driver module outputs the m-th detection scan driver signal in the high level pulse form, the gate scan driver signal is at the low level, the output end of the m-th data selector selects the second input end and outputs the m-th detection scan driver signal to corresponding m-th gate scan line so as to perform detection on the driver TFT and OLED in the m-th column of pixel unit circuits.

3. The structure of AMOLED driver circuit with external compensation as claimed in claim 2, wherein the detection scan driver signal propagates to the next stage only during the V-blanking of each frame.

4. The structure of AMOLED driver circuit with external compensation as claimed in claim 3, wherein During the V-blanking duration of the (m+1)-th frame, the (m+1)-th first shift register of the detection scan driver module outputs the (m+1)-th detection scan driver signal in the high level pulse form, the gate scan driver signal is at the low level, the output end of the (m+1)-th data selector selects the second input end and outputs the (m+1)-th detection scan driver signal to corresponding (m+1)-th gate scan line so as to perform detection on the driver TFT and OLED in the (m+1)-th column of pixel unit circuits.

5. The structure of AMOLED driver circuit with external compensation as claimed in claim 1, wherein the source of the switch TFT is connected to the data signal of the row where the corresponding pixel unit circuit belongs provided by the source driver module; the gate of the driver TFT is connected to the drain of the switch TFT, the drain is connected to the high level power source; the source of the detection TFT is connected to the source of the driver TFT, the drain is connected to the detection module through the routing of the row where the corresponding pixel unit circuit belongs; the anode of the OLED is connected to the source of the driver TFT and the cathode is connected to the low level power source.

6. The structure of AMOLED driver circuit with external compensation as claimed in claim 5, wherein the detection circuit of the detection module corresponding to each pixel unit circuit is an integrator comprising an operational amplifier and a capacitor, the negative input end of the operational amplifier is connected to the drain of the detection TFT of the corresponding pixel unit circuit, and the positive input end is connected to the common mode voltage, the capacitor has one end connected to the negative input end of the operational amplifier and the other end connected to the output end of the operational amplifier.

7. The structure of AMOLED driver circuit with external compensation as claimed in claim 2, wherein during the normal display of the m-th frame, a logic signal 0 is inputted to the control end of each data selector to control the output end of each data selector to selects the first input end.

8. The structure of AMOLED driver circuit with external compensation as claimed in claim 2, wherein during the V-blanking of the m-th frame, a logic signal 1 is inputted to the control end of the m-th data selector to control the output end of the m-th data selector to selects the second input end.

9. A structure of AMOLED driver circuit with external compensation, which comprises: a plurality of pixel unit circuits arranged in an array, a detection scan driver module, a gate scan driver module, a source driver module electrically connecting each row of pixel unit circuits, a detection module electrically connecting each column of pixel unit circuits, and a data selector disposed corresponding to each column of pixel unit circuits; wherein:

the pixel unit circuit comprises: a switch thin film transistor (TFT), a driver TFT, a detection TFT and an organic light-emitting diode (OLED);

the detection scan driver module comprises: a plurality of cascade first shift registers having the same number as the number of the columns of pixel unit circuits, n being a positive integer, the n-th first shift register connected through an n-th detection scan line to the gate of the detection TFT in the corresponding n-th column of pixel unit circuits to provide a detection scan driver signal to the n-th column of pixel unit circuits;

the gate scan driver module comprises: a plurality of cascade second shift registers having the same number as the number of the columns of pixel unit circuits, the n-th second shift register connected to a first input end of the n-th data selector to provide a gate scan driver signal to the n-th column of pixel unit circuits;

the n-th data selector has a second input end inputting the detection scan driver signal provided by the n-th first shift register of the detection scan driver module, and an output end connected through the n-th scan line to the gate of the switch TFT in the n-th column of pixel unit circuits;

the detection scan driver signal has a timing different from the timing of the gate scan driver signal;

for a positive integer m, during normal display of the m-th frame, the plurality of the second shift registers of the gate scan driver module outputs the gate scan driver signals for each column of pixel unit circuits in a high level pulse form and a normal stage-by-stage manner, the detection scan driver signal is at the low level, the output end of each data selector selects the first input end and outputs gate scan driver signal to corresponding gate scan line; during the V-blanking of the m-th frame, the m-th first shift register of the detection scan driver module outputs the m-th detection scan driver signal in the high level pulse form, the gate scan driver signal is at the low level, the output end of the m-th data selector selects the second input end and outputs the m-th detection scan driver signal to corresponding m-th gate scan line so as to perform detection on the driver TFT and OLED in the m-th column of pixel unit circuits;

the detection scan driver signal propagates to the next stage only during the V-blanking of each frame; and the source of the switch TFT is connected to the data signal of the row where the corresponding pixel unit circuit belongs provided by the source driver module; the gate of the driver TFT is connected to the drain of the switch TFT, the drain is connected to the high level power source; the source of the detection TFT is connected to the source of the driver TFT, the drain is connected to the detection module through the routing of the row where the corresponding pixel unit circuit belongs; the anode of the OLED is connected to the source of the driver TFT and the cathode is connected to the low level power source.

10. The structure of AMOLED driver circuit with external compensation as claimed in claim 9, wherein During the V-blanking duration of the (m+1)-th frame, the (m+1)-th first shift register of the detection scan driver module outputs the (m+1)-th detection scan driver signal in the high level pulse form, the gate scan driver signal is at the low level, the output end of the (m+1)-th data selector selects the second input end and outputs the (m+1)-th detection scan driver signal to corresponding (m+1)-th gate scan line so as to perform detection on the driver TFT and OLED in the (m+1)-th column of pixel unit circuits.

11. The structure of AMOLED driver circuit with external compensation as claimed in claim 9, wherein the detection circuit of the detection module corresponding to each pixel unit circuit is an integrator comprising an operational amplifier and a capacitor, the negative input end of the operational amplifier is connected to the drain of the detection TFT of the corresponding pixel unit circuit, and the positive input end is connected to the common mode voltage, the capacitor has one end connected to the negative input end of the operational amplifier and the other end connected to the output end of the operational amplifier.

12. The structure of AMOLED driver circuit with external compensation as claimed in claim 9, wherein during the normal display of the m-th frame, a logic signal 0 is inputted to the control end of each data selector to control the output end of each data selector to selects the first input end.

13. The structure of AMOLED driver circuit with external compensation as claimed in claim 9, wherein during the V-blanking of the m-th frame, a logic signal 1 is inputted to the control end of the m-th data selector to control the output end of the m-th data selector to selects the second input end.

* * * * *